(12) United States Patent
Stene

(10) Patent No.: US 7,526,056 B1
(45) Date of Patent: Apr. 28, 2009

(54) DELAY LOCKED LOOP WITH LOW JITTER

(75) Inventor: Melvin W. Stene, Pocatello, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 11/929,765

(22) Filed: Oct. 30, 2007

Related U.S. Application Data

(63) Continuation of application No. 10/602,195, filed on Jun. 24, 2003, now Pat. No. 7,342,985.

(51) Int. Cl.
*H03D 3/24* (2006.01)
(52) U.S. Cl. .................. 375/376; 375/373; 327/149; 327/158
(58) Field of Classification Search .......... 375/373, 375/376; 327/149, 158
See application file for complete search history.

(56) References Cited

U.S. PATENT DOCUMENTS

| | | | |
|---|---|---|---|
| 6,137,325 A | 10/2000 | Miller, Jr. | |
| 6,201,424 B1 | 3/2001 | Harrison | |
| 6,281,726 B1 | 8/2001 | Miller, Jr. | |
| 6,316,976 B1 | 11/2001 | Miller, Jr. et al. | |
| 6,337,590 B1 | 1/2002 | Millar | |
| 6,429,715 B1 | 8/2002 | Bapat et al. | |
| 6,452,431 B1 | 9/2002 | Waldrop | |
| 6,469,555 B1 | 10/2002 | Lau et al. | |
| 6,731,147 B2 * | 5/2004 | Fiscus | 327/158 |
| 2003/0215040 A1 | 11/2003 | Bell et al. | |

OTHER PUBLICATIONS

Office Action dated Mar. 2, 2007 for related U.S. Appl. No. 10/602,195.

* cited by examiner

*Primary Examiner*—Temesghen Ghebretinsae
(74) *Attorney, Agent, or Firm*—Workman Nydegger

(57) ABSTRACT

Digital delay locked loops which generate fixed angle delayed (e.g., quadrature) clock signals based on a reference clock signal and that accounts for clock signal delay. The number of quadrature delay elements is calculated based on the number of delay elements needed to provide one or more cycles of delay, and adjusted to reflect system clock delay. The digital delay locked loop also acquires a locked state quickly by sampling more frequently before acquiring the lock than after. Furthermore, jitter is reduced by introducing hysteresis into the sampling process, and by disabling the delay element adjustment process during jitter sensitive times. Lock stability is improved by introducing hysteresis into the lock detection process.

8 Claims, 5 Drawing Sheets

DELAY LOCKED LOOP WITH LOW JITTER

CROSS-REFERENCE TO RELATED APPLICATIONS

This application is a continuation application of common assigned, U.S. patent application Ser. No. 10/602,195 filed Jun. 24, 2003 now U.S. Pat. No. 7,342,985, and entitled "Delay Locked Loop with Fixed Angle De-Skew, Quick Start and Low Jitter", which patent application is incorporated herein by reference in its entirety.

REFERENCE TO A COMPUTER PROGRAM PRODUCT LISTING APPENDIX SUBMITTED ON A COMPACT DISK

This patent application includes a compact disk that includes a single text file of the computer program that is included after paragraph 0057 of this specification. The text file is incorporated herein by reference in its entirety.

BACKGROUND

It is often important to the proper operation of many circuits that the various parts of the overall circuit are synchronized. This is especially true of high speed circuits, which often have critical timing requirements. In order to accomplish synchronization, clock signals are propagated throughout the circuit. Without compensation, significant skew may be introduced into the clock signal due to propagation delay, thereby adversely affecting the performance of the circuit. This skew can be quite significant when all parts of the circuit are not on the same component, and may even be significant when all parts of the circuit are on the same chip in high speed applications. A significant source of skew is in the system clock tree in which a variety of clock signals of varying frequencies and duty cycles are generated based directly or indirectly on a reference clock.

In order to compensate for this skew, some conventional circuits intentionally introduce delay into the reference clock signal prior to the reference clock signal being provided to a system clock tree. The intentionally introduced delay, when added to the delay introduced by the clock tree results in the reference clock signal after being propagated through the system clock tree to be approximately in phase with the reference clock signal prior to the introduction of the intentional delay.

One way of intentionally producing this delay is to pass the reference clock signal through a delay line having an adjustable number of delay elements, each introducing a relatively fixed amount of delay to the reference clock. The number of delay elements through which the reference clock passes is then adjusted until a phase detector detects that the phase of the reference clock signal after the system clock tree is appropriately equal to the phase of the reference clock signal provided to the phase detector. A delay line and phase detector in this configuration are referred to as a delay locked loop since the configuration is able to generate a signal having a relatively fixed (or locked) amount of delay with respect to a reference clock signal.

While this method is useful for providing a derived clock signal that is in phase with a reference clock signal (albeit with one or more cycles of delay) while accounting for system clock tree skew, the method does not allow for quadrature or other clock signals having a fixed angle of delay to be generated while compensating for system clock tree skew. The method has no mechanism for calculating a clock cycle in terms of delay elements. Accordingly, the method does not facilitate the generation of a quadrature or other clock signal having a fixed angle of delay to be generated while at the same time compensating for system clock tree skew.

There are also conventional circuits that generate a quadrature clock signal or a clock signal with some fixed angle of delay based on a reference signal. Such circuits accomplish this by using a delay line having an adjustable number of delay elements. The number of delay elements are adjusted until the phase of the reference clock signal at the output terminal of the delay line is approximately the same as (but with one or more cycles of delay) the phase of the reference clock signal provided to the input terminal of the phase detector. Based on the number of delay elements needed to accomplish this, the number of delay elements that are needed to generate a fixed angle of delay is then calculated. The reference signal is then provided to another delay line and passed through that calculated number of delay elements to generate the delayed clock signal that is derived from the reference clock signal. While such circuits allow for the generation of a derived clock signal having a fixed angle of delay with respect to the reference clock signal, the period of delay introduced into the derived clock signal is independent of system clock tree skew introduced into the path of the derived clock signal having the fixed angle of delay.

Accordingly, what would be advantageous is a delay locked loop circuit that generates a clock signal that has a fixed angle of delay with respect to a reference clock signal while at the same time accounting for system clock delay. It would further be advantageous if the delay locked loop circuit reaches an accurate locked state quickly to thereby increase the proportion of time that the delay locked loop circuit is locked and therefore accurately generating a phase delayed signal, and thereby shortening system initialization time. What would further be advantageous is a delay locked loop circuit in which jitter is reduced. Jitter is a common problem in delay locked loop circuit and refers to the frequent and extensive change in phase difference between the derived clock signal and the reference clock signal. Larger jitter profiles tend to reduce system performance and reduced ability to run at higher frequencies due to the correspondingly reduced timing margins between multiple system devices.

BRIEF SUMMARY OF THE INVENTION

The foregoing problems with the prior state of the art are overcome by the principles of the present invention which are directed towards a variety of delay locked loop circuits.

Jitter may be reduced by introducing hysteresis into the sampling process by introducing a sampling filter between the phase detector and the control circuit in delay locked loop. Conventionally, the number of delay elements is adjusted every time the phase of the clock signal at the output terminal of the delay line is outside of a phase window with respect to the clock signal at the input terminal of the delay line. However, in a digital delay locked loop, the clock signal at the output of the delay line may sometimes fall slightly outside of the phase window due to simple digital precision error rather than the signals wandering more persistently out of the phase window. The sampling filter prevents any adjustment in the number of delay elements until some predetermined number of consecutive signals from the phase detector indicates that the control signals are either consistently lagging or consistently leading. This would largely prevent or at least reduce unnecessary phase adjustments due to precision error, and would thereby reduce jitter.

Additional features and advantages will be set forth in the description that follows, and in part will be obvious from the description, or may be learned by the practice of the invention. The features and advantages may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention involve advanced digital delay locked loops which may generate fixed angle delayed clock signals (e.g., quadrature clock signals) with respect to a reference clock signal and that accounts for system clock delay. The digital delay locked loop circuit also acquires a locked state quickly by sampling more frequently before acquiring the lock than after. Furthermore, jitter is reduced by introducing hysteresis into the sampling process, and by disabling the delay element adjustment process during jitter sensitive times. Lock stability is improved by introducing hysteresis into the lock detection process.

Quadrature De-Skew

Figure 1:
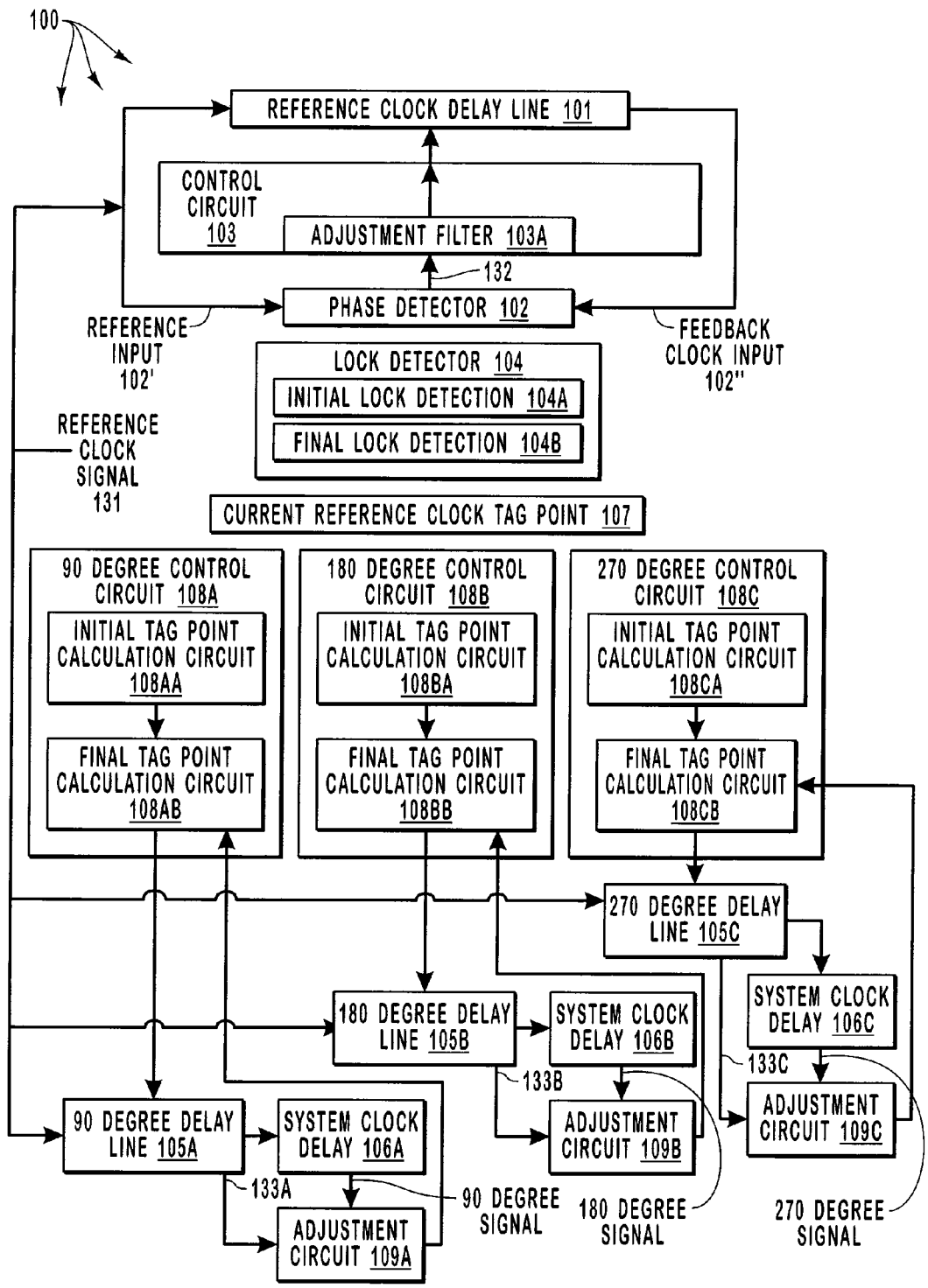
FIG. 1 illustrates delay locked loop circuit in accordance with the principles of the present invention.

FIG. 1 illustrates a digital delay locked loop circuit 100 in accordance with the principles of the present invention. The delay locked loop circuit 100 operates in a reset mode, and in an operational mode. When in the operational mode, the delay locked loop circuit 100 is configured to generate a number of quadrature clock signals of a reference clock signal while compensating for system clock delay. For instance, the delay locked loop circuit 100 generates three quadrature clock signals, a 90 degree quadrature clock signal, a 180 degree quadrature clock signal, and a 270 degree quadrature clock signal, each accounting for system clock delay. However, the principles of the present invention may be applied to digital delayed lock loop circuits that generate other fixed angle delay as well, and any other number of fixed angle delayed clock signals as well.

Figure 2:
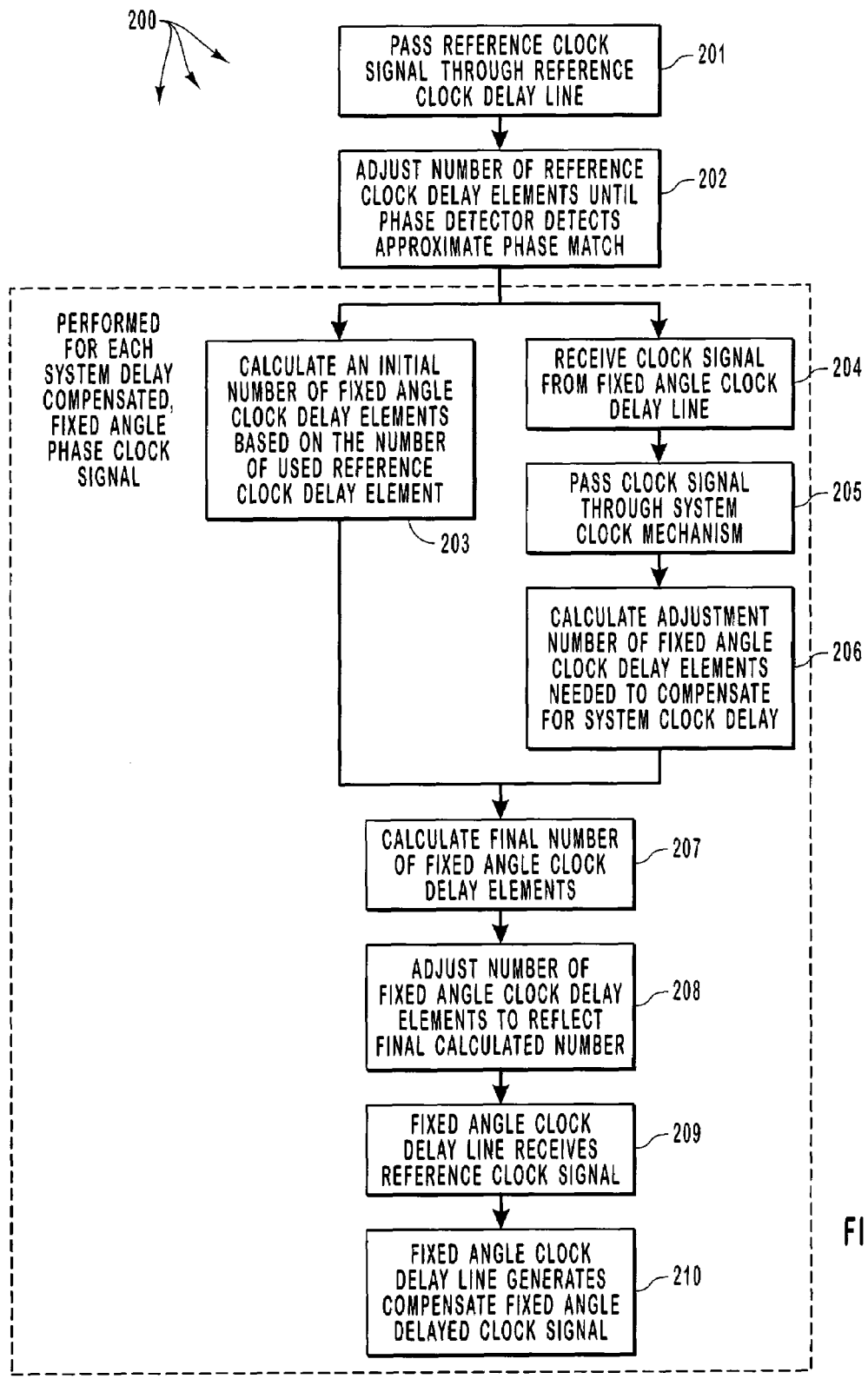
FIG. 2 illustrates a flowchart of a method for generating a fixed angle delayed clock signal with respect to a reference clock signal while compensating for skew introduced by system clock delay in accordance with a first aspect of the present invention.

FIG. 2 illustrates a flowchart of a method 200 for generating the fixed angle delayed clock signals, whether quadrature or otherwise. Accordingly, the method 200 of FIG. 2 will be described with frequent reference to the delay locked loop circuit 100 of FIG. 1. A reference clock signal upon which all of the fixed angle delayed clock signals are based is passed through a reference clock delay line (act 201). For example, in FIG. 1, the reference clock signal 131 is passed to reference clock delay line 101. The reference clock delay line 101 includes a number of delay elements, each introducing a relatively fixed amount of delay to signals that are input to that delay element. The total delay introduced into the reference clock signal by the reference clock delay line 101 may be adjusted by adjusting the number of delay elements through which the signals pass.

In one embodiment of the present invention, the reference clock delay line 101 is structured as a two-dimensional array of delay elements, instead of the conventional one-dimensional series of delay element. The use of the two-dimensional array of delay elements reduces degradation of the reference clock signal.

The delay locked loop circuit 100 then adjusts the number of reference clock delay elements through which the reference clock signal 131 passes in the reference clock delay line 101 until the phase detector 102 detects an approximate phase match between the reference clock signal received at its feedback clock input 102" from the output terminal of the reference clock delay line 101 and the reference clock signal received at its reference input 102' (act 202). This is accomplished in FIG. 1 using the reference clock phase detector 102 and the control circuit 103.

The reference clock phase detector circuit 102 detects whether the reference clock signal at its feedback clock input leads or lags the reference clock signal at its reference input 102'. In this case, the reference clock signal received at the reference input 102' is the same as the reference clock signal 131 with no delay introduced. However, in other embodiments, the reference clock signal received at the reference input 102' may have some delay as compared to the reference clock signal 131. If the reference clock signals at the reference input and feedback clock input lags each other by too much, then the phase detector 102 sends an up or down signal to the control circuit as represented by arrow 132. The phase detector 102 may be any one of numerous phase detectors. The operation and structure or phase detectors are generally known to those of ordinary skill in the art.

The phase detector 102 includes a shift register (not shown) that ensures that the phase detector only generates up and down control signals based on actual phase detection when the reference clock signal at the input and output terminals of the reference clock delay line 101 are within falling edges.

Otherwise, the phase detector 102 may provide unstable results thereby minimizing or maximizing the tag point in the reference clock delay line without the signals being in lock. Until the phase detector 102 is granted control, the phase detector output 132 is constantly in increment mode, causing the delay to be continuously added in the reference clock delay line 101. This mode of operation is commonly referred to as "open loop" with continuous increment updates until control is passed onto the phase detector to operate in "closed loop".

The following VERILOG Hardware Description Language code describes among other things a shift register that enables this functionality:

```
module pfd_dll(CLKIN,CLKFB,UP,DOWN,RN,CLKEN,PFDBYPASS,PFDWIN);
   input CLKIN,CLKFB,RN,CLKEN,PFDBYPASS,PFDWIN;
   output UP,DOWN;
   buf I0 (.Q(CLKIN_BUF),.A(CLKIN));
   buf I1 (.Q(RN_BUF),.A(RN));
   dflop I2 (.Q(PHCNTRL_I),.QN( ),.C(CLKIN_BUF),.D(VLDCNTRLD),
         .RN(RN_BUF));
   mux2 I3 (.Q(VLDCNTRLD),.I0(PHCNTRL_I),.I1(1'b1),.S(VLDCNTRL_SEL));
   dflop I4 (.Q(VLDCNTRL_SEL),.C(CLKIN_BUF),.D(VLDCNTRL_SEL),.SD(1'b1),
         .SE(VLDCNTRL),.RN(RN_BUF));
   mux2 I5 (.Q(VLDCNTRL),.I0(VLDCNTRL_SML),.I1(VLDCNTRL_LRG),
         .S(PFDWIN));
   aa4 I6 (.Q(VLDCNTRL_SML),.A(I4_QN),.B(I3OUT),.C(I2OUT),.D(I1OUT));
   aa4 I7 (.Q(VLDCNTRL_LRG),.A(I14_QN),.B(I13OUT),.C(I12OUT),
         .D(I_INT));
   aa2 I8 (.Q(I_INT),.A(I11OUT),.B(I10OUT));
   dflop I9 (.Q(I0OUT),.QN(I0_QN),.C(CLKIN_BUF),.D(I0OUT),.SD(CLKFB),
         .SE(CLKEN),.RN(RN_BUF));
   dflop I10 (.Q(I1OUT),.QN(I1_QN),.C(CLKIN_BUF),.D(I1OUT),.SD(I0OUT),
         .SE(CLKEN),.RN(RN_BUF));
   dflop I11 (.Q(I2OUT),.QN(I2_QN),.C(CLKIN_BUF),.D(I2OUT),.SD(I1OUT),
         .SE(CLKEN),.RN(RN_BUF));
   dflop I12 (.Q(I3OUT),.QN(I3_QN),.C(CLKIN_BUF),.D(I3OUT),.SD(I2OUT),
         .SE(CLKEN),.RN(RN_BUF));
   dflop I13 (.Q(I4OUT),.QN(I4_QN),.C(CLKIN_BUF),.D(I4OUT),.SD(I3OUT),
         .SE(CLKEN),.RN(RN_BUF));
   dflop I14 (.Q(I5OUT),.QN(I5_QN),.C(CLKIN_BUF),.D(I5OUT),.SD(I4OUT),
         .SE(CLKEN),.RN(RN_BUF));
   dflop I15 (.Q(I6OUT),.QN(I6_QN),.C(CLKIN_BUF),.D(I6OUT),.SD(I5OUT),
         .SE(CLKEN),.RN(RN_BUF));
   dflop I16 (.Q(I7OUT),.QN(I7_QN),.C(CLKIN_BUF),.D(I7OUT),.SD(I6OUT),
         .SE(CLKEN),.RN(RN_BUF));
   dflop I17 (.Q(I8OUT),.QN(I8_QN),.C(CLKIN_BUF),.D(I8OUT),.SD(I7OUT),
         .SE(CLKEN),.RN(RN_BUF));
   dflop I18 (.Q(I9OUT),.QN(I9_QN),.C(CLKIN_BUF),.D(I9OUT),.SD(I8OUT),
         .SE(CLKEN),.RN(RN_BUF));
   dflop I19 (.Q(I10OUT),.QN(I10_QN),.C(CLKIN_BUF),.D(I10OUT),.SD(I9OUT),
         .SE(CLKEN),.RN(RN_BUF));
   dflop I20 (.Q(I11OUT),.QN(I11_QN),.C(CLKIN_BUF),.D(I11OUT),.SD(I10OUT),
         .SE(CLKEN),.RN(RN_BUF));
   dflop I21 (.Q(I12OUT),.QN(I12_QN),.C(CLKIN_BUF),.D(I12OUT),.SD(I11OUT),
         .SE(CLKEN),.RN(RN_BUF));
   dflop I22 (.Q(I13OUT),.QN(I13_QN),.C(CLKIN_BUF),.D(I13OUT),.SD(I12OUT),
         .SE(CLKEN),.RN(RN_BUF));
   dflop I23 (.Q(I14OUT),.QN(I14_QN),.C(CLKIN_BUF),.D(I14OUT),.SD(I13OUT),
         .SE(CLKEN),.RN(RN_BUF));
   dflop I24 (.Q(DWNII),.QN(UPII),.C(CLKIN_BUF),.D(CLKFB),.SN(RN_BUF));
   dflop I25
(.Q(DWNI),.QN(PFDREG0_QN),.C(CLKIN_BUF),.D(DWNII),.RN(RN_BUF));
   or2 I26 (.Q(PHCNTRL),.A(PHCNTRL_I),.B(PFDBYPASS));
   aa2 I27 (.Q(DOWN),.A(PFDREG0_QN),.B(PHCNTRL));
   na2 I28 (.Q(UP),.A(PFDREG0_QN),.B(PHCNTRL));
endmodule
```

The reference clock control circuit 103 adjusts the number of reference clock delay elements through which the reference clock signal passes (i.e., adjusts the tag point) in response to the signals from the phase detector 102 when the delay locked loop circuit 100 is not operating in the reset mode. If the delay locked loop circuit 100 is operating in the reset mode, the reference clock control circuit 103 causes the reference clock signal to pass through only a certain fixed amount of reference clock delay elements. The control circuit 103 also includes an adjustment filter 103A that introduces hysteresis into the sampling process. This hysteresis reduces jitter thereby improving the accuracy of the delay locked loop circuit 100. More regarding the adjustment filter 103A will be described below with respect to FIG. 4.

Referring to FIG. 1, the delay locked loop circuit 100 also includes a number of quadrature delay lines 105A, 105B and 105C. The delay locked loop circuit 100 is configured such that the 90 degree quadrature delay line 105A ultimately outputs a clock signal that after passing through system clock delay 106A results in a 90 degree quadrature clock signal that is based on the reference clock signal and that compensates for system clock delay 106A. Furthermore, the quadrature delay line 105B ultimately outputs a clock signal that after passing through system clock delay 106B results in a 180 degree quadrature clock signal that is based on the reference clock signal and that compensates for system clock delay 106B. Finally, the quadrature delay line 105C ultimately outputs a clock signal that after passing through system clock delay 106C results in a 270 degree quadrature clock signal that is based on the reference clock signal and that compensates for system clock delay 106C. In addition to 90, 180, and 270 degree quadrature clock signals, the principles of the present invention may be employed to generate any fixed angle delayed clock signal (e.g., 70 degrees) that is based on the reference clock signal and that compensates for system clock delay. The delay lines 105A, 105B and 105C may also have a two-dimensional structure and may be exact replicas of delay line 101 to thereby increase accuracy of the fixed angle delayed clock signal. However, the delay lines 105A, 105B and 105C may have any other structures in which the number of delay elements may be adjusted and the amount of delay introduced by a delay element is relatively predicable.

The delay locked loop circuit 100 calculates an initial number of quadrature clock delay elements in a quadrature clock delay line needed to generate a quadrature clock signal of the reference clock signal (act 203). This calculation will also be referred to as the "initial calculation." This initial calculation may be performed for each of the system delay compensated, fixed angle clock signals, and may be continuously performed, or performed at certain intervals. This calculation may be based on the number of reference clock delay elements used at the time the phase detector 102 detects an approximate phase match between its reference input and feedback clock input.

For example, referring to FIG. 1, the delay locked loop circuit 100 includes a memory location that includes the current reference clock tag point 107. A 90 degree control circuit 108A determines the appropriate tag point for the 90 degree delay line 105A; the 180 degree control circuit 108B determines the appropriate tag point for the 180 degree delay line 105B, and the 270 degree control circuit 108C determines the appropriate tag at point for the 270 degree delay line 105C.

The initial calculation may be performed for the 90 degree delay line 105A by the initial tag point calculation circuit 108AA of the 90 degree control circuit 108A. For example, if the current reference clock tag point is 100, then the initial calculation will result in 25 delay elements.

The initial calculation may be performed for the 180 degree delay line 105B by the initial tag point calculation circuit 108BA of the 180 degree control circuit 108A. For example, if the current reference clock tag point is 100, then the initial calculation will result in 50 delay elements.

The initial calculation may be performed for the 270 degree delay line 105C by the initial tag point calculation circuit 108CA of the 270 degree control circuit 108C. For example, if the current reference clock tag point is 100, then the initial calculation will result in 75 delay elements.

Referring back to FIG. 2, a clock signal is received from the fixed angle clock delay line (act 204). This clock signal may be a delayed version of the reference clock signal for example. Referring to FIG. 1, the clock signal from the 90 degree delay line 105A is received by the adjustment circuit 109A as represented by the arrow 133A; the clock signal from the 180 degree delay line 105B is received by the adjustment circuit 109B as represented by the arrow 133B; and the clock signal from the 270 degree delay line 105C is received by the adjustment 109C as represented by the arrow 133C.

Referring back to FIG. 2, the clock signal is also passed through a system clock mechanism that introduces the system clock delay (act 205). For example, the clock signal from the 90 degree delay line 105A is passed through a system clock mechanism that introduces system clock delay 106A and then is provided to the adjustment circuit 109A as represented by arrow 134A; the clock signal from the 180 degree delay line 105B is passed through a system clock mechanism that introduces system clock delay 106B and then is provided to the adjustment circuit 109B as represented by arrow 134B; and the clock signal from the 270 degree delay line 105C is passed through a system clock mechanism that introduces system clock delay 106C and then is provided to the adjustment circuit 109C as represented by arrow 134C.

Referring back to FIG. 2, the delay locked loop circuit 100 then calculates an adjustment number of fixed angle clock delay elements needed to account for the system clock delay using the clock signal received from the fixed angle clock delay line and the clock signal after having passed through the system clock mechanism (act 206). Referring to FIG. 1, this may be accomplished for the 90 degree delay line 105A by the adjustment circuit 109A, for the 180 degree delay line 105B by the adjustment circuit 109B, and for the 270 degree delay line 105C by the adjustment circuit 109C.

Figure 7:
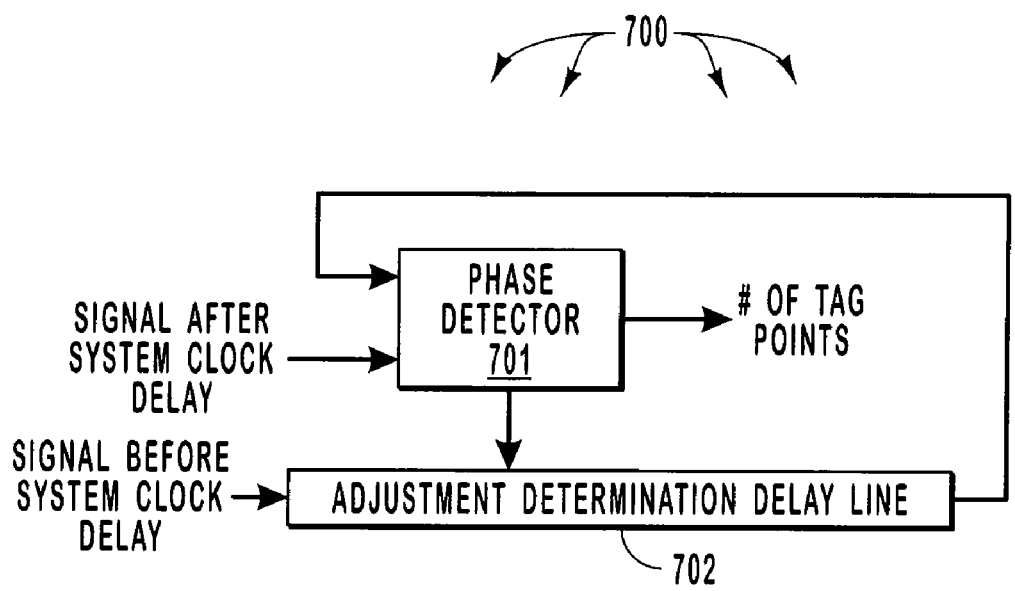
FIG. 7 illustrates a more detailed diagram of an adjustment determination circuit that may be used as the adjustment circuit of FIG. 1.

FIG. 7 illustrates an adjustment circuit 700 that may be used for any one of the adjustment circuits 109A, 109B, and 109C. The adjustment circuit 700 includes a phase detector 701 and an adjustment determination delay line 702. The delay line 702 receives the clock signal before being subject to the system clock delay. The phase detector 701 receives and compares phases for the signal after having been subject to the system clock delay, and the signal before being subject to the system clock delay and after having passed through the delay line 702. The phase detector 701 then adjusts the tap point of the delay line 702. Based on the amount of adjustment performed before a lock is detected, the phase detector 701 then calculates the adjustment number of delay elements needed to compensate for the system clock delay.

Referring back to FIG. 1, the adjustment circuit 109A provides a signal representing the adjustment number for the 90 degree delay line to a final tag point calculation circuit 108AB of the 90 degree control circuit 108A. The adjustment circuit 109B provides a signal representing the adjustment number for the 180 degree delay line to a final tag point calculation circuit 108BB of the 180 degree control circuit 108B. The adjustment circuit 109C provides a signal representing the adjustment number for the 270 degree delay line to a final tag point calculation circuit 108CB.

Referring to FIG. 2, the delay locked loop circuit 100 then calculates a final number of fixed angle clock delay elements needed to generate a quadrature clock signal that accounts for system clock delay by adjusting the initial number of fixed angle clock delay elements by the adjustment number of fixed angle clock delay elements (act 207).

Referring to FIG. 1, this may be accomplished by the final tag point calculation circuit 108AB for the 90 degree delay line 105A. For example, if the current reference clock tag point 107 is 100 delay elements, the initial number of delay elements (25 elements) would be adjusted by the adjusted number of delay elements (say, for example, 11 delay elements) needed to compensate for system clock delay 106A. The final number of delay elements would be 14 delay elements needed to generate a 90 degree quadrature signal based on the reference clock signal and that accounts for the system clock delay 106A.

The may also be accomplished by the final tag point calculation circuit 108BB for the 180 degree delay line 105B. For example, if the current reference clock tag point 107 is 100 delay elements, the initial number of delay elements (50 elements) would be adjusted by the adjusted number of delay elements (say, for example, 12 delay elements) needed to compensate for system clock delay 106B. The final number of delay elements would be 38 delay elements needed to generate a 180 degree quadrature signal based on the reference clock signal and that accounts for the system clock delay 106B.

For the 270 degree delay line 105C, this may be accomplished by the final tag point calculation circuit 108CB for the 270 degree delay line 105C. For example, if the current reference clock tag point 107 is 100 delay elements, the initial number of delay elements (75 elements) would be adjusted by the adjusted number of delay elements (say, for example, 14 delay elements) needed to compensate for system clock delay 106C. The final number of delay elements would be 61 delay elements needed to generate a 270 degree quadrature signal based on the reference clock signal and that accounts for the system clock delay 106C.

Note that in some cases the adjustment number of delay elements may be greater than the initial number of delay elements. To avoid a negative final number of delay elements, the initial number may take into consideration harmonics of the fixed angle delay signal to be generated. For example, suppose that the current reference clock tag point 107 is 100 delay elements. Typically, the initial number of delay elements used to generate a 90 degree signal would be 25 delay elements. However, if there is a real possibility that the adjustment number needed to compensate for system clock delay would be greater than 25, then the initial number may be instead 125 elements.

Referring to FIG. 1, the delay locked loop circuit 100 then adjusts the number of fixed angle clock delay elements through which the input clock signal passes in the fixed angle clock delay line to reflect (i.e., to be equal or proportional to) the calculated final number of fixed angle clock delay elements (act 208). Thereafter, when the reference clock signal is received by the corresponding fixed angle clock delay line (act 209), that fixed angle clock delay line passes the reference clock signal through the final number of fixed angle clock delay elements (act 210). The delayed reference clock signal is then output from the fixed angle clock delay line in the form of the fixed angle delayed clock signal that accounts for system clock delay.

Dynamic Loop Tuning for Quick Lock Acquisition

In accordance with a second aspect of the present invention, a pseudo locked state is quickly acquired by sampling more frequently prior to pseudo lock as compared to after pseudo lock. Referring to FIG. 1, the lock detector 104 detects or estimates when the fixed angle delay lines are likely generating a proper fixed angle delayed signal. This estimation may be potentially made by detecting that the reference clock lock detector 104 is detecting an approximate phase match at its inputs (i.e., the reference loop has stabilized) and then potentially adding a certain number of clock cycles before asserting a lock condition to insure that the fixed angle clock control circuits sufficient time to stabilize. Alternatively, the estimation of the lock condition may be potentially made by detecting an approximate phase match in a lock detector for some independent feedback loop that includes a separate delay line. When this phase match is detected, the system is referred to herein as being in "pseudo lock".

In one embodiment, the lock detector 104 includes an initial lock detection circuit 104A as well as a final lock detection circuit 104B. The final lock detection circuit 104B introduces hysteresis into the lock detection process, to thereby improve stability in lock detection. More regarding the lock detection circuit 104, the initial lock detection circuit 104A, and the final lock detection circuit 104B will be described below with respect to FIG. 5.

As previously mentioned, in accordance with the second aspect of the invention, a pseudo locked state is quickly acquired by sampling more frequently prior to pseudo lock as compared to after pseudo lock. For instance, in the context of the delay locked loop circuit 100 of FIG. 1, sampling occurs by recalculating the initial number, the adjustment number and final number of fixed angle delay elements. Alternatively, sampling may include more generally monitoring the feedback of the reference loop, fixed angle delay line feedback, or an independent feedback loop to determine whether the system is stable. For instance, sampling might occur every eight clock cycles before a pseudo lock is detected, and perhaps every 154 clock cycles after a pseudo lock is detected. This allows pseudo lock to be obtained more rapidly thereby extending the useful life of the delay locked loop. Furthermore, rapid acquisition of a locked state thereby shortening system boot time.

Figure 3:
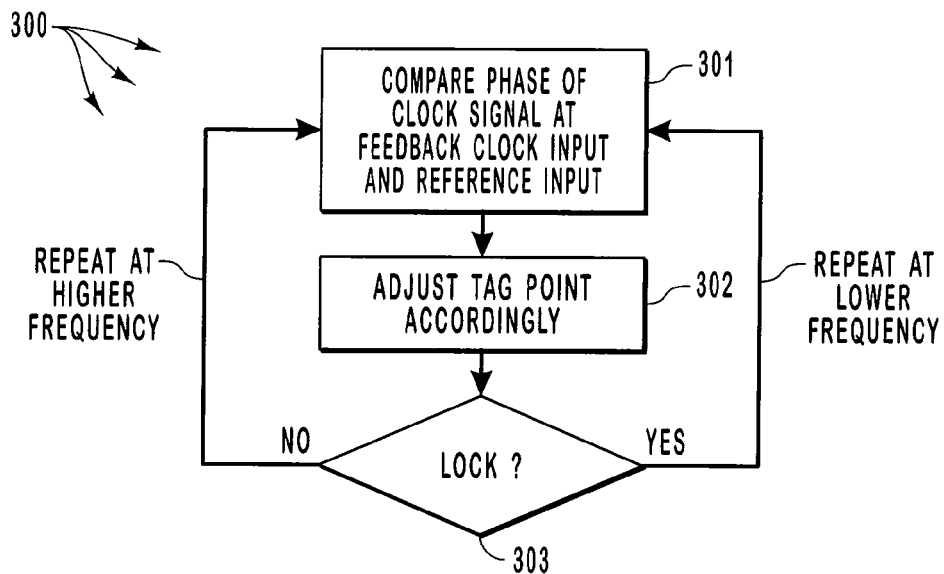
FIG. 3 illustrates a flowchart of a method for obtaining a quick lock in a delay locked circuit by sampling more frequently prior to pseudo locking than after pseudo locking in accordance with a second aspect of the present invention.

This quick start aspect of the present invention may be implemented in any delay locked loop circuit that samples by a phase detector comparing the phase of a clock signal at its feedback clock input after having passed through a delay line with the phase of the clock signal at its reference input before having passed through a delay line, and the phase detector or other control circuit adjusting the number of delay elements through which the clock signal passes in response to the comparison. FIG. 3 illustrates a flowchart of a method 300 for performing dynamic loop tuning for quick lock acquisition in accordance with the principles of the present invention.

Whether or not lock has been obtained, the method 300 includes acts of comparing a phase of the clock signal at its feedback clock input after having passed through a delay line with the phase of the clock signal at it reference input before having passed through the delay line (act 301). Then, the number of delay elements through which the clock signal passes is potentially adjusted (i.e., the delay line tag point is potentially adjusted) if the phase of the clock signal at the feedback clock input of the phase detector is not approximately in phase with the reference input of the phase detector (act 302).

If lock is not obtained (NO in decision block 303), then the acts of comparing and adjusting are repeater at a relatively high frequency compared to after pseudo lock is obtained. Once it has been determined that pseudo lock has been obtained (YES in decision block 303); in other words, the clock signal at the feedback clock input of the phase detector is approximately in phase with clock signal at the reference input of the phase detector, then the acts of comparing and adjusting are performed at a lower frequency as compared to before lock is obtained.

Phase Detect Filter with Built in Hysteresis

In accordance with a third aspect of the present invention, jitter in this or any digital delay locked loop may be reduced by introducing hysteresis into the sampling process by introducing a sampling filter between the phase detector and the control circuit. Conventionally, the number of delay elements used in a delay line is adjusted every time the phase detector samples that its inputs are outside of a certain phase window with respect to each other. However, in a digital delay locked loop, the clock signal at the feedback clock input of the phase detector may sometimes fall slightly outside of the phase window due to simple digital precision error rather than the signals wandering more persistently out of the phase window. The sampling filter prevents any adjustment in the number of delay elements until some predetermined number of consecutive signals from the phase detector indicates that the control signals is either consistently lagging or consistently leading. This would largely prevent unnecessary phase adjustments due to precision error, and would thereby reduce jitter.

The sampling filter is represented in FIG. 1 by the adjustment filter 103A. In the example implementation of FIG. 1, the phase detector 102 generates an up or down signal potentially every 8 clock cycles. Before pseudo lock, sampling occurs every 8 clock cycles as well. Recall that sampling means that not only is a phase comparison made, but that a detected phase difference is reflected by a tap point adjustment in the delay line. Accordingly, in order to allow this adjustment every 8 clock cycles, the adjustment filter simply allows all of the up/down signals from the phase detector 102 to be reflected in a tag point adjustment in the reference clock delay line 101 prior to pseudo lock. In one embodiment in which the adjustment filter is only updated at the rate of every 8 reference clock cycles, 8 consecutive up or down signals would actually take 64 reference clock cycles.

After pseudo lock, however, the adjustment filter 103A takes on a filtering role. Specifically, the phase detector 102 still generates, and the adjustment filter 103A still receives an up/down signal every 8 clock cycles. After pseudo lock, however, the adjustment filter 103A waits for a predetermined number (e.g., 8) of consecutive down signals before it actually reflects a down adjustment of the tag point in the reference clock delay line 101. Similarly, the adjustment filter 103B waits for a predetermined number (e.g., also 8) of consecutive up signals before it actually reflects an up adjustment of the tag point in the reference clock delay line 101.

The following illustrates Verilog Hardware Description Language code that describes a very specific example filter in accordance with one embodiment of the present invention.

```
module                                                                    lowpassfltr
(DOWN,UP,CLKENO,CLKEN2,CLOCK,U,D,SAMPLENO,RESETN,FLOCK2);
    input CLKENO,CLKEN2,U,D,CLOCK,RESETN,FLOCK2;
    output DOWN,UP,SAMPLENO;
    reg [4:0] UPENREG,STATE,NEXT_STATE;
    REG UP,DOWN,UP_I,DOWN_I,UPENRSTREG,PURGEREG;
    Wire UPENRST,CLKENI,PURGE;
    Parameter THIRTEENN = 5'b11001,
        TWELVEN = 5'b11010,
        ELEVENN = 5'b11111,
        TENN = 5'b11110,
        NINEN = 5'b11101,
        EIGHTEN = 5'b11100,
        SEVENN = 5'B10101,
        SIXN = 5'b10100,
        FIVEN = 5'b10111
        FOURN = 5'b10110,
        THREEN = 5'b10011,
        TWON = 5'b10010,
        ONEN = 5'B10001,
        ZERO = 5'b00000,
        ONEP = 5'b00001,
        TWOP = 5'b00010
        THREEP = 5'b00011,
        FOURP = 5'b00110,
        FIVEP = 5'b00111,
        SIXP = 5'b00100,
        SEVENP = 5'b00101,
        EIGHTP = 5'b01100,
        NINEP = 5'b01101,
        TENP = 5'b01110,
        ELEVENP = 5'b01111,
        TWELVEP = 5'b01010,
        THIRTEENP = 5'b01001,
    always @(posedge CLOCK or negedge RESETN or negedge PURGREG)
        begin
            if (!RESETN)
                begin
                    UP = 0;
                    DOWN = 0;
                end
            else if (!PURGREG)
                begin
                    UP = 0;
                    DOWN = 0;
                end
                else if (CLKENI)
                    begin
                        UP = UP_I;
                        DOWN = DOWN_I
                    end
        end
    always @(posedge CLOCK or negedge RESETN)
        begin
            if (!RESETN)
                UPENREG = 0;
            else if (CLKEN2)
                if (UPENREG == 5'b1000l)
```

-continued

```
        UPENREG = 0;
      else
        UPENREG = UPENREG + 1;
end
assign                    UPENRST                    =
((!UPENREG[4]||UPENREG[3]||UPENREG[2]||UPENREG[1]||UPENREG[O
        ((!UPENREG[4]||UPENREG[3]||UPENREG[2]||UPENREG[1]||!UPENREG[
assign                    PURGE                      =
((!UPENREG[4]||UPENREG[3]||UPENREG[2]||UPENREG[1]||!UPENREG[O])     assign
SAMPLENO                                             =
(UPENREG[4]&&!UPENREG[3]&&!UPENREG[2]&&!UPENREG[1]&&UPENREG
assign                    CLKENI                     =
(!(!UPENREG[4]||UPENREG[3]||UPENREG[2]||UPENREG[1]||UPENREG[O
always @(posedge CLOCK or negedge RESETN)
   begin
      if(!RESETN)
        UPENRSTREG = 1'bO;
      else if(CLKEN2)
        UPENRSTREG = UPENRST;
   end
always @(posedge CLOCK or negedge RESETN)
begin
   if (!RESETN)
      PURGE REG = 1'bO;
   else if(CLKEN2)
      PURGEREG = PURGE;
end
always @(posedge CLOCK or negedge RESETN or negedge UPENRSTREG)
   begin
      if(!RESETN)
         STATE = 0;
      else if(!UPENRSTREG)
         STATE = 0;
           else if(CLKENO &&FLOCK2)
              STATE = NEXT_STATE;
   end
always @(STATE or U or D)
begin
   case (STATE)
     THIRTEENN:
       begin
         DOWN_I = 1'b1;
         UP_I = 1'bO;
         if(U)
            NEXT STATE = TWELVEN;
         else if(D)
            NEXT STATE = THIRTEENN;
               else
                  NEXT STATE = THIRTEENN;
       end // case: THIRTEENN
     TWELVEN:
       begin
         DOWN_I = 1'b1;
         UP_1 -= 1'bo;
         if(U)
            NEXT_STATE = ELEVENN;
         else if(D)
            NEXT_STATE = THIRTEENN;
               else
                  NEXT_STATE = TWELVEN;
       end // case: TWELVEN
     ELEVENN:
       begin
         DOWN I = 1'b1;
         UP 1 -= 1'bO;
         if(U)
            NEXT_STATE = TENN;
         else if(D)
            NEXT_STATE = TWELVEN;
               else
                  NEXT_STATE = ELEVENN
       end // case: ELEVENN
     TENN:
       begin
         DOWN_I = 1'b1;
         UP_1 -= 1'bO;
         if(U)
            NEXT_STATE = NINEN;
         else if(D)
```

-continued

```
                NEXT_STATE = ELEVENN;
            else
                NEXT_STATE = TENN;
    end // case: TENN
NINEN:
    begin
        DOWN_I = 1'b1;
        UP_I = 1'bO;
        if(U)
            NEXT_STATE = EIGHTN;
        else if(D)
            NEXT_STATE = TENN;
            else
                NEXT_STATE = NINEN;
    end // case: NINEN
EIGHTN:
    begin
        DOWN_I = 1'b1;
        UP_I = 1'bO;
        if(U)
            NEXT_STATE = SEVENN;
        else if(D)
            NEXT_STATE = NINEN;
            else
                NEXT_STATE = EIGHTN;
    end // case: EIGHTN
SEVENN:
    begin
        DOWN_I = 1'bO;
        UP_I = 1'bO;
        if(U)
            NEXT_STATE = SIXN;
        else if(D)
            NEXT_STATE = EIGHTN;
            else
                NEXT_STATE = SEVENN;
    end // case: SEVENN
SIXN:
    begin
        DOWN_I = 1'bO;
        UP_I = 1'bO;
        if(U)
            NEXT_STATE = FIVEN;
        else if(D)
            NEXT_STATE = SEVENN;
            else
                NEXT_STATE = SIXN;
    end // case: SIXN
FIVEN:
    begin
        DOWN_I = 1'bO;
        UP_I = 1'bO;
        if(U)
            NEXT_STATE = FOURN;
        else if(D)
            NEXT_STATE = SIXN;
            else
                NEXT_STATE = FIVEN;
    end // case: FIVEN
FOURN:
    begin
        DOWN_I = 1'bO;
        UP_I = 1'bO;
        if(U)
            NEXT_STATE = THREEN;
        else if(D)
            NEXT_STATE = FIVEN;
            else
                NEXT_STATE = FOURN;
    end // case: FOURN
THREEN:
    begin
        DOWN_I = 1'bO;
        UP_I = 1'bO;
        if(U)
            NEXT_STATE = TWON;
        else if(D)
            NEXT_STATE = FOURN;
            else
```

-continued

```
            NEXT_STATE = THREEN;
        end // case: THREEN
    TWON:
        begin
            DOWN_I = 1'bO;
            UP_I = 1'bO;
            if(U)
                NEXT_STATE = ONEN;
            else if(D)
                NEXT_STATE = THREEN;
                    else
                        NEXT_STATE = TWON;
        end // case: TWON
    ONEN:
        begin
            DOWN_I = 1'bO;
            UP_1 = 1'bO;
            if(U)
                NEXT_STATE = ZERO;
            else if(D)
                NEXT_STATE = TWON;
                    else
                        NEXT_STATE = ONEN;
        end // case: ONEN
    ZERO:
        begin
            DOWN_I = 1'bO;
            UP_I = 1'bO;
            if(U)
                NEXT_STATE = ONEP;
            else if(D)
                NEXT_STATE = ONEN;
                else
                    NEXT_STATE = ZERO;
        end // case: ZERO
    ONEP:
        begin
            DOWN_I = 1'bO;
            UP_I = 1'bO;
            if(U)
                NEXT_STATE = TWOP;
            else if(D)
                NEXT_STATE = ZERO;
                    else
                        NEXT_STATE = ONEP;
        end // case: ONEP
    TWOP:
        begin
            DOWN_I = 1'bO;
            UP_I = 1'bO;
            if(U)
                NEXT_STATE = THREEP;
            else if(D)
                NEXT_STATE = ONEP;
                    else
                        NEXT_STATE = TWOP;
        end // case: TWOP
    THREEP:
        begin
            DOWN_I = 1'bO;
            UP_I = 1'bO;
            if(U)
                NEXT_STATE = FOURP;
            else if(D)
                NEXT_STATE = TWOP;
                    else
                        NEXT_STATE = THREEP;
        end // case: THREEP
    FOURP:
        begin
            DOWN_I = 1'bO;
            UP_I -= 1'bO;
            if(U)
                NEXT_STATE = FIVEP;
            else if(D)
                NEXT_STATE = THREEP;
                else
                    NEXT_STATE = FOURP;
        end // case: FOURP
```

```
FIVEP:
  begin
    DOWN_I = 1'bO; UP_I = 1'bO;
    if(U)
      NEXT_STATE = SIXP;
    else if(D)
      NEXT_STATE = FOURP;
        else
          NEXT_STATE = FIVEP;
  end // case: FIVEP
SIXP:
  begin
    DOWN_I = 1'bO;
    UP_I = 1'bO;
    if(U)
      NEXT_STATE = SEVENP;
    else if(D)
      NEXT_STATE = FIVEP;
        else
          NEXT_STATE = SIXP:
  end // case: SIXP
SEVENP:
  begin
    DOWN_I = 1'bO;
    UP_I = 1'bO;
    if(U)
      NEXT_STATE = EIGHTP;
    else if(D)
      NEXT_STATE = SIXP;
        else
          NEXT_STATE = SEVENP;
  end // case: SEVENP
EIGHTP:
  begin
    DOWN_I = 1'bO;
    UP_I = 1'b1;
    if(U)
      NEXT_STATE = NINEP;
    else if(D)
      NEXT_STATE = SEVENP;
        else
          NEXT_STATE = EIGHTP;
  end // case: EIGHTP
NINEP:
  begin
    DOWN_I = 1'bO;
    UP_I = 1'b1;
    if(U)
      NEXT_STATE = TENP;
    else if(D)
      NEXT_STATE = EIGHTP;
        else
          NEXT_STATE = NINEP;
  end // case: NINEP
TENP:
  begin
    DOWN_I = 1'bO;
    UP_I -= 1'b1;
    if(U)
      NEXT_STATE = ELEVENP;
    else if(D)
      NEXT_STATE = NINEP;
        else
          NEXT_STATE = TENP;
  end // case: TENP
ELEVENP:
  begin
    DOWN_I = 1'bO;
    UP_I = 1'b1;
    if(U)
      NEXT_STATE = TWELVEP;
    else if(D)
      NEXT_STATE = TENP;
        else
          NEXT_STATE = ELEVENP;
  end // case: ELEVENP
TWELVEP:
  begin
    DOWN_I = 1'bO;
```

```
            UP_I = 1'b1;
         if(U)
            NEXT_STATE = THIRTEENP;
         else if(D)
            NEXT_STATE = ELEVENP
               else
                  NEXT_STATE = TWELVEP;
      end // case: TWELVEP
   THIRTEENP:
      begin
         DOWN_I = 1'bO;
         UP_I -= 1'b1;
         if(U)
            NEXT_STATE = THIRTEENP;
         else if(D)
            NEXT_STATE = TWELVEP;
               else
                  NEXT_STATE = THIRTEENP,
      end // case: THIRTEENP
   default:
      begin
         DOWN_I = 1'bO;
         UP_I = 1'bO;
         if(U)
            NEXT_STATE = ONEP;
         else if(D)
            NEXT_STATE = ONEN;
               else
                  NEXT_STATE = ZERO;
      end // case: ZERO
         endcase // case (STATE)
         end // always @ (STATE or U or D)
   endmodule
```

Figure 4:
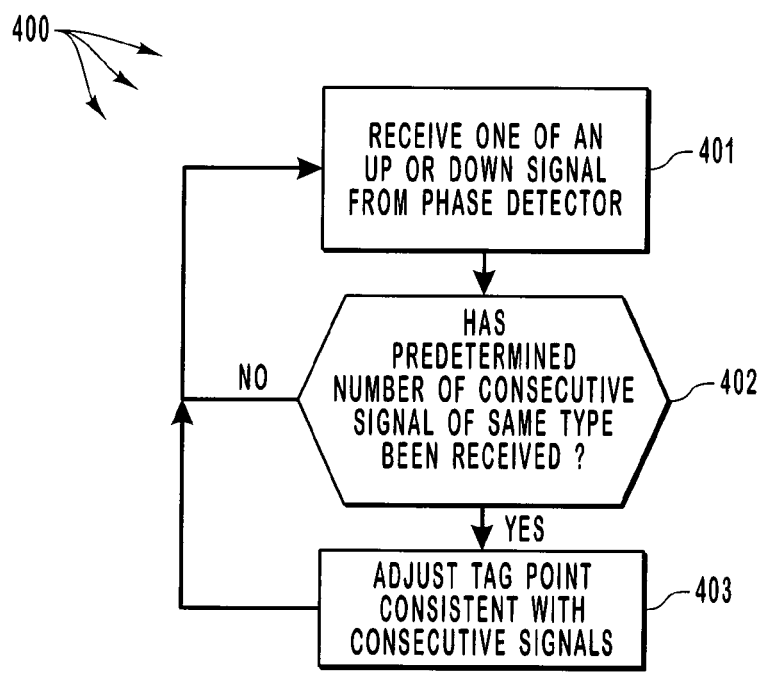
FIG. 4 illustrates a flowchart of a method for adjusting the number of delay elements through which the reference clock signal passes in the delay line by introducing hysteresis into the sampling process to thereby reduce jitter in accordance with a third aspect of the present invention.

FIG. 4 illustrates a flowchart of a more general method 400 for filtering the sampling of a delay locked loop circuit that may be applicable to any delay locked loop circuit in which the tap point of a delay line is adjusted in response to phase detection of the signal at the feedback clock input and reference clock input of the phase detector.

The sampling filter receives one of an up or down signal from the phase detector (act 401). If this receipt results in a predetermined number of consecutive up signals or a predetermined number of consecutive down signals to be received (YES in decision block 402), then the tag point is adjusted (act 403), and the process returns to the sampling filter receiving another signal from the phase detector (act 401). Otherwise (NO in decision block 402), the process returns to the filter receiving another signal from the phase detector (act 401) without having adjusted the tag point and the process repeats.

DLL Lock Detect Filter

In accordance with a fourth aspect of the present invention, stability and robustness are introduced into the lock detection process by introducing hysteresis into the lock detection mechanism. This hysteresis alleviates spurious lock deassertions. Conventionally, a lock detection mechanism changes a lock status from unlocked to locked when the clock signal at the feedback clock input and reference input of a lock detector first fall inside of a phase window with respect to each other after a period of falling outside of the phase window. Similarly, the lock status is changed from locked to unlocked when the clock signal at the feedback clock input and reference input of a lock detector first falls outside of the phase window after a period of being within the phase window. In one embodiment, the lock detector is closely coupled with the phase detector. For example the delay locked loop circuit may have a specification for the pull-in/phase offset range for the phase detector. This range represents the statistical accuracy of how accurately the reference clock may be matched with the feedback clock excluding jitter. From that specification, one may calculate the required lock window that accommodates the offset and widen to accommodate jitter while insuring a window limit that still allows an accurate non-lock condition. In short, the lock detection is performed by a lock detector and the lock detector is tightly coupled with the phase detector.

Hysteresis is introduced by using a hysteresis variable. The variable is changed in one direction if it is determined that the clock signal at the output terminal of the delay line is within the phase window, and otherwise changes the hysteresis value in the opposite direction. The lock status is only changed from locked to unlocked once the value reaches or crosses one predetermined value, and is changed from unlocked to locked once the value reaches or crosses another predetermined value.

Figure 5:
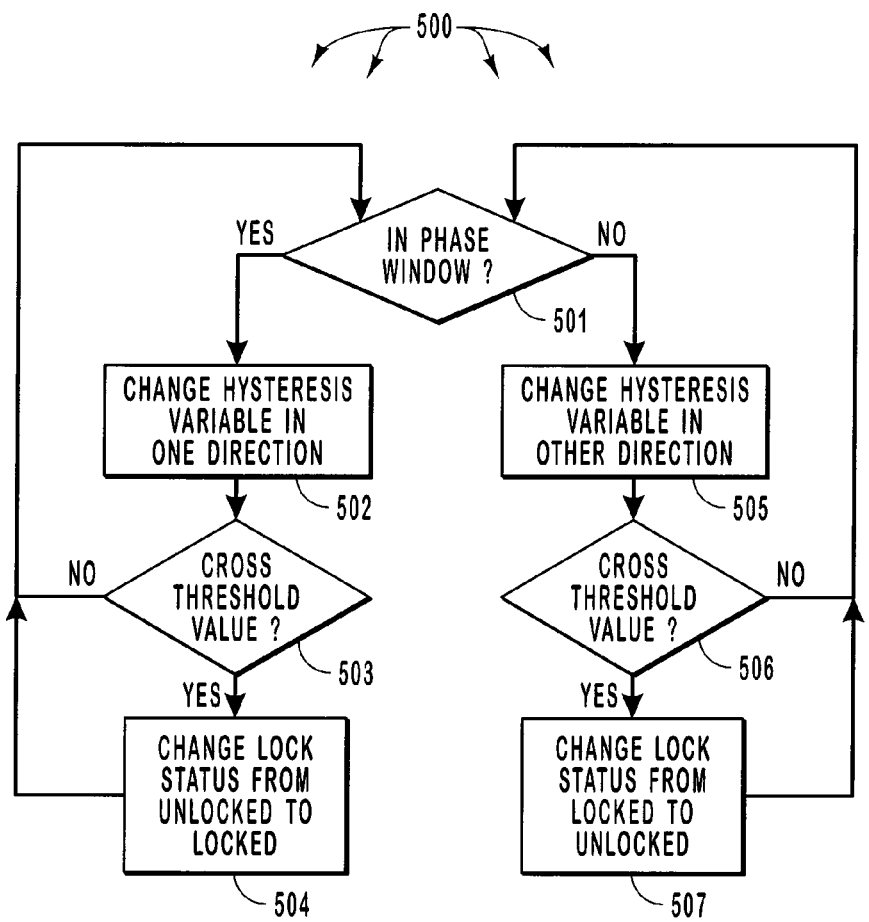
FIG. 5 illustrates a flowchart of a method for introducing hysteresis into the lock detection processes to thereby improve lock stability in accordance with a fourth aspect of the present invention.

Referring to FIG. 1, the lock detection filter is illustrated in the form of final lock detection circuit 104B, where the initial lock detection circuit 104A actually detects whether the clock signals (i.e., the reference and feedback clock signals) at the feedback clock input of input of the lock detector is within the lock window. FIG. 5 illustrates a flowchart of a method 500 for introducing hysteresis into the lock detection mechanism and may be performed by the final lock detection circuit 104B of FIG. 1 or by a lock detection mechanism in another delay locked loop. When referring to lock detection in the context of the digital delay locked loop 100 of FIG. 1, lock detection refers to pseudo-lock detection.

First, it is determined whether or not the clock signal at the reference clock input is within a predetermined phase window relative to the clock signal at the reference input of the lock detector (decision block 501). If it is determined that it is within the phase window (YES in decision block 501), then the value of the hysteresis variable is changed in one direction (e.g., is increased) (act 502). If the lock detection currently has an unlocked status, and if the change causes the hysteresis variable to cross a certain threshold value (YES in decision block 503), then the lock status is changed from unlocked to locked (act 504). If the change does not cause the hysteresis value to cross a threshold value (NO in decision block 503), then the next signal from the initial lock detection circuit 104A is evaluated to determine if the clock signal is in the phase window (back to decision block 501) and the process is repeated.

If it is determined that the clock signal at the feedback clock input of the lock detector is not in the phase window (NO in decision block 501), then the value of the hysteresis variable is changed in the opposite direction (e.g., is decreased) (act 505). If the lock detection currently has a locked status, and if the change causes the hysteresis variable to cross a certain threshold value (YES in decision block 506), then the lock status is changed from locked to unlocked (act 507). If the change does not cause the hysteresis variable to cross a threshold value (NO in decision block 506), then the next signal from the initial lock detection circuit 104A is evaluated to determine if the clock signal is in the phase window (back to decision block 501) and the process is repeated. The threshold value for changing from locked to unlocked status, and the threshold value for changing from unlocked to locked status may be different or the same.

Accordingly, mere precision error in the lock detection process will not on its own cause the lock status to change. The lock status will more likely only change when the phase of the output clock signal truly warrants the change in lock status as when the signal phase is drifting.

The following Verilog Hardware Description Language code illustrates an example of the lock detection filter that introduces this hysteresis and in which the predetermined threshold values are 40 and 56:

```
module                                                              lockavg
(CLK,CLKEN,RST,DIR,PLOCK,FLOCK,FLOCK1,FLOCK2,SAMPLENO,LCKBYPASS)
;
    input CLK,CLKEN,RST,DIR,SAMPLENO,LCKBYPASS;
    output PLOCK, FLOCK, FLOCK1, FLOCK2;
    reg [5:0] COUNTER;
    reg PLOCK,FLOCK,FLOCKO,FLOCK1,FLOCK2;
    wire DIR_I;
    assign DIR_I = LCKBYPASS || DIR;
    always@(posedge CLK or negedge RST)
        begin
            if(!RST)
                COUNTER = 0;
            else if (CLKEN)
                case (DIR_I)
                1'bO:
                    begin
                        if (COUNTER == 0)
                            COUNTER = 0;
                        else
                            COUNTER = COUNTER - 1;
                    end // case: 1'bO
                1'b1:
                    begin
                        if (COUNTER == 63)
                            COUNTER = 63;
                        else
                            COUNTER = COUNTER + 1;
                    end
                endcase // case (DIR)
        end // always@ (posedge CLK or negedge RST)
    always@(posedge CLK or negedge RST)
        begin
            if(!RST)
                PLOCK = 1'bO;
            else if ((COUNTER <= 40) &&CLKEN)
                PLOCK = 1'bO;
                else if((COUNTER >= 56) &&CLKEN)
                    PLOCK = 1'b1;
                    else
                        PLOCK = PLOCK;
        end
    always@(posedge CLK or negedge RST)
        begin
            if (!RST)
                begin
                    FLOCKO <= 1'bO;
                    FLOCKI <= 1'bO;
                    FLOCK2 <= 1'bO;
                    FLOCK <= 1'bO;
                end
            else if(CLKEN &&SAMPLENO)
            // else if(CLKEN)
                begin
                    FLOCKO <= PLOCK;
```

```
        FLOCK1 <= FLOCKO&&PLOCK;
        FLOCK2 <= FLOCK1&&PLOCK;
        FLOCK <= FLOCK2&&PLOCK;
      end
    end // always@ (posedge CLK or negedge RST)
endmodule
```

DLL with Control Loop Lockout

In accordance with a fifth aspect of the present invention, sensitivity to jitter is reduced by disabling any adjustments in the number of delay elements used in the delay line during a period of jitter sensitivity. The control circuit that adjusts the delay elements would receive a disable signal indicating that the adjustable number of delay element is not to be adjusted for at least a period of time indicated by the assertion of the disable signal. Then, even if the control circuit receives one or more signal from the phase detector that would normally cause the control circuit to adjust the number of delay elements, the control circuit maintains the number of delay elements the same.

Figure 6:
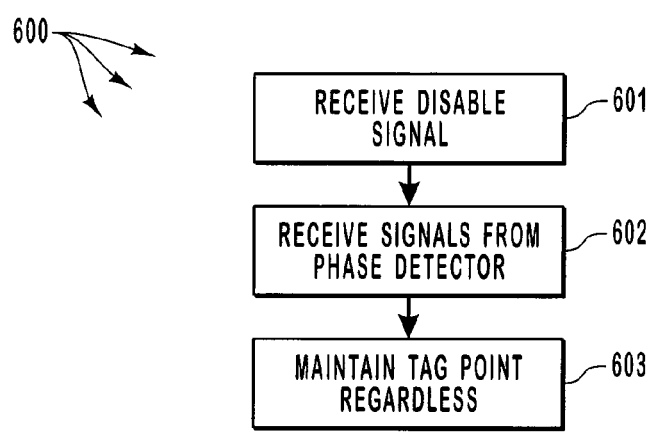
FIG. 6 illustrates a flowchart of a method for at least temporarily disabling adjustment of the number of delay elements through which a reference clock signal passes in a reference clock delay line to thereby reduced sensitivity to jitter in accordance with a fifth aspect of the present invention.

FIG. 6 illustrates a flowchart of a method 600 for disabling the control circuit in accordance with the principles of the present invention. The method 600 may be performed by the control circuit 102 of FIG. 1, or in the control loop (i.e., the interacting delay line and phase detector) of any other delay locked loop circuit.

The control circuit receives a disable signal indicating that the adjustable number of reference clock delay element is not to be adjusted for at least a period of time (act 601). Then the control circuit receives one or more signals from the phase detector that would cause the control circuit to adjust the number of reference clock delay elements through which the reference clock signal passes had the disable signal not been received (act 602). The control circuit then maintains the number of reference delay elements through which the reference clock signal passes to be the same during the period of time despite the control circuit having received the one or more signals from the phase detector circuit (act 603).

Accordingly, a delay locked loop circuit has been described that may generate quadrature signals based on a reference signal and that compensates for system clock delay. Furthermore, the delay locked loop acquires the lock status rapidly by sampling more frequently before pseudo lock than after pseudo lock. Also, jitter is controlled by 1) introducing hysteresis into the sampling processes, and/or 2) disabling tag point adjustment during certain jitter sensitive times. In addition, lock detection is made more stable by introducing hysteresis into the lock detection process.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. In a delay locked loop circuit that includes a delay line configured to receive a clock signal and pass the clock signal through an adjustable number of delay elements, a phase detector circuit configured to sample a phase of a clock signal at an output terminal of the delay line and received at a feedback clock input of the phase detector and the clock signal received at a reference input of the phase detector, the phase detector configured to generate a first signal when the phase of the clock signal at the feedback clock input of the phase detector is not approximately equal to the phase of the reference clock signal at a reference input of the phase detector and the variance is in a first direction, wherein the phase detector is further configured to generate a second signal when the phase of the clock signal at the feedback clock input of the phase detector is not approximately equal to the phase of the reference clock signal at the reference input of the phase detector and the variance is in a second direction that is opposite the first direction, a method for adjusting the number of delay elements through which the clock signal passes in the delay line, the method comprising the following:

when operating in an operational mode after pseudo-lock,
  an act of a filter receiving a first signal from the phase detector;
  an act of determining whether the reception of the first signal results in a predetermined number of multiple consecutive first signals being received from the phase detector; and
  an act of adjusting the adjustable number of delay elements through which the clock signal passes in the delay line if there has been the predetermined number of multiple consecutive first signals received from the phase detector without any intervening second signals being received from the phase detector; and
  an act of preventing adjustment of the adjustable number of elements through which the clock signal passes in the delay line if there has not been the predetermined number of multiple consecutive first signals received from the phase detector; and when operating in a reset mode before pseudo-lock, an act of allowing signals from the phase detector to adjust the number of delay elements through which the clock signal passes in the delay line without waiting for the predetermined number of multiple consecutive first signals or for the predetermined number of multiple consecutive second signals.

2. A method in accordance with claim 1, wherein the predetermined multiple number is a first predetermined number, the method further comprising the following when in the operational mode:

an act of the filter receiving a second signal from the phase detector;
an act of determining whether the reception of the second signal results in a second predetermined multiple number of consecutive second signals being received from the phase detector;
an act of adjusting the adjustable number of delay elements through which the clock signal passes in the delay line if there has been the second predetermined multiple number of consecutive second signals received from the phase detector, and otherwise not adjusting the number of delay elements.

3. A method in accordance with claim 2, wherein the first predetermined multiple number is the same as the second predetermined number.

4. A method in accordance with claim 2, wherein the act of adjusting the adjustable number of delay elements through which the clock signal passes in the delay line if there has been the first predetermined multiple number is performed in a different direction as when performing the act of adjusting the adjustable number of delay elements through which the clock signal passes in the delay line if there has been the second predetermined multiple number.

5. A method in accordance with claim 1, wherein the predetermined multiple number is more than two.

6. A method in accordance with claim 5, wherein the predetermined multiple number is eight.

7. A method in accordance with claim 1, wherein the act determining whether the reception of the first signal results in a predetermined multiple number of consecutive first signals being received from the phase detector further comprises the following during operational mode:
  an act of determining whether the reception of the first signal results in a predetermined multiple number of consecutive first signals being received from the phase detector, the predetermined multiple number of consecutive first signals being uninterrupted in time from a flush signal in which the filter memory is reset.

8. A delay locked loop circuit comprising the following:
  a delay line configured to receive a clock signal and pass the clock signal through an adjustable number of delay elements;
  a phase detector configured to compare a phase of a clock signal at an output terminal of the delay line and received at a feedback clock input of the phase detector and the clock signal received at a reference input of the phase detector, and configured to generate a first signal when the phase of the clock signal at the feedback clock input of the phase detector is not approximately equal to the phase of the reference clock signal at a reference input of the phase detector and the variance is in a first direction, wherein the phase detector is further configured to generate a second signal when the phase of the feedback clock input of the phase detector is not approximately equal to the phase of the reference clock signal at a reference input of the phase detector and the variance is in a second direction that is opposite the first direction;
  a filter that is configured to perform the following after pseudo-lock:
    an act of receiving a first signal from the phase detector;
    an act of determining whether the reception of the first signal results in a predetermined multiple number of consecutive first signals received from the phase detector;
    an act of causing an adjustment in the adjustable number of delay elements through which the clock signal passes in the delay line if there has been the predetermined multiple number of consecutive first signals received from the phase detector without any intervening second signals being received from the phase detector; and
    an act of preventing adjustment of the adjustable number of elements through which the clock signal passes in the delay line if there has not been the predetermined number of multiple consecutive first signals received from the phase detector without any intervening second signals being received from the phase detector, wherein before pseudo-lock, the filter is not configured to cause the delay locked loop to await the predetermined number of multiple consecutive first signals or the predetermined number of multiple consecutive second signals before allowing the adjustable number of elements through which the clock signal passes in the delay line to be adjusted.

\* \* \* \* \*

UNITED STATES PATENT AND TRADEMARK OFFICE
CERTIFICATE OF CORRECTION

PATENT NO. : 7,526,056 B1 Page 1 of 1
APPLICATION NO. : 11/929765
DATED : April 28, 2009
INVENTOR(S) : Stene It is certified that error appears in the above-identified patent and that said Letters Patent is hereby corrected as shown below:

Column 3
Line 47, change "reduced" to --reduce--

Column 7
Line 18, change "predicable" to --predictable--
Line 47, change "108A" to --108B--

Column 8
Line 4, change "134A" to --133A--
Line 7, change "134B" to --133B--
Line 11, change "134C" to --133C--
Line 63, change "The may" to --This may--

Column 10
Line 18, change "state" to --state is obtained,--
Line 34, change "it" to --its--
Line 43, change "repeater" to --repeated--

Column 11
Line 1, change "is" to --are--

Column 12
Line 11, change "103B" to --103A--

Column 25
Line 20, change "signal" to --signals--
Line 30, change "element" to --elements--

Signed and Sealed this

Sixteenth Day of March, 2010

David J. Kappos
*Director of the United States Patent and Trademark Office*